United States Patent
Kudou et al.

(10) Patent No.: US 7,639,205 B2
(45) Date of Patent: Dec. 29, 2009

(54) RADIO WAVE SHIELD

(75) Inventors: Toshio Kudou, Amagasaki (JP);
Kazuyuki Kashihara, Amagasaki (JP)

(73) Assignee: Mitsubishi Cable Industries, Ltd., Tokyo (JP)

( * ) Notice: Subject to any disclaimer, the term of this patent is extended or adjusted under 35 U.S.C. 154(b) by 497 days.

(21) Appl. No.: 11/506,849

(22) Filed: Aug. 21, 2006

(65) Prior Publication Data

US 2007/0075910 A1    Apr. 5, 2007

(30) Foreign Application Priority Data

Sep. 30, 2005    (JP) .............................. 2005-287004

(51) Int. Cl.
*H01Q 15/02* (2006.01)
(52) U.S. Cl. ................. 343/909; 343/700 MS
(58) Field of Classification Search .......... 343/700 MS, 343/909
See application file for complete search history.

(56) References Cited

U.S. PATENT DOCUMENTS

| 5,214,432 A | 5/1993 | Kasevich et al. |
| 6,563,472 B2 * | 5/2003 | Durham et al. ........... 343/781 P |
| 6,836,258 B2 * | 12/2004 | Best et al. .................... 343/909 |
| 6,885,355 B2 * | 4/2005 | Killen et al. ................. 343/909 |

FOREIGN PATENT DOCUMENTS

| EP | 1 720 396 | 11/2006 |
| EP | 1 853 103 | 11/2007 |
| JP | 10-169039 | 6/1988 |
| JP | 6-99972 | 12/1994 |
| JP | 10-126090 | 5/1998 |
| JP | 11-195890 | 7/1999 |
| JP | 11-261286 | 9/1999 |
| JP | 11-330773 | 11/1999 |
| JP | 2000-196288 | 7/2000 |
| JP | 2001-345632 | 12/2001 |
| JP | 2003-060430 | 2/2003 |
| JP | 2003-069282 | 3/2003 |
| JP | 2005-142748 | 6/2005 |
| WO | 2005/084097 | 9/2005 |

OTHER PUBLICATIONS

European Patent Office issued an European Search Report dated Jun. 9, 2009, Application No. 06 01 6429.0.

* cited by examiner

*Primary Examiner*—Tan Ho
(74) *Attorney, Agent, or Firm*—Young & Thompson

(57) ABSTRACT

A radio wave shield selectively shields radio waves of a specific frequency band.

18 Claims, 6 Drawing Sheets 3 2 8 10
1

1 { 3
    2
    8
    9

RADIO WAVE SHIELD

CROSS-REFERENCE TO RELATED APPLICATIONS

This application claims priority under 35 U.S.C. §119 on Patent Applications No. PCT/JP2006/302660 and 2005-287004 filed in Japan respectively on Feb. 14, 2006 and Sep. 30, 2005, the entire contents of which are hereby incorporated by reference.

BACKGROUND OF THE INVENTION

The present invention relates to a radio wave shield.

Recently, radio wave equipment such as in-house PHS and radio LAN is being rapidly prevailing. In accordance with the prevalence, it has become indispensable to adjust the radio wave environment within an office for preventing information leakage and preventing malfunction or noise caused by externally intruding radio waves. Therefore, various techniques for adjusting the radio wave environment have been proposed (see, for example, Japanese Patent Publication No. 6-99972 and Japanese Laid-Open Patent Publication No. 10-169039).

Japanese Patent Publication No. 6-99972 discloses a technique to construct a skeleton of a building by using concrete including an electromagnetic shielding material made of an electromagnetic wave reflector or an electromagnetic wave absorber. However, the electromagnetic shielding material described in Japanese Patent Publication No. 6-99972 does not have frequency selectivity. In other words, this electromagnetic shielding material shields incident radio waves regardless of their frequencies. Therefore, in the technique described in Japanese Patent Publication No. 6-99972, a radio wave of a specific frequency cannot be selectively shielded but radio waves of frequencies not to be shielded are shielded.

On the other hand, Japanese Laid-Open Patent Publication No. 10-169039 discloses a technique to secure an electromagnetic shielded space within a building by forming an electromagnetic shielding plane by periodically arranging Y-shaped linear antennas. It is described that a radio wave of a necessary frequency alone can be electromagnetically shielded by this technique.

Most of conventional radio wave equipment have used radio waves of one or more specific frequencies (with a fractional bandwidth of 10% or less). However, radio wave equipment using radio waves of a specific frequency band with a given width (such as a cellular phone) has been recently proposed. Accordingly, there are increasing needs for a radio wave shield for adjusting the radio wave environment in an office or a building where such radio wave equipment using a specific frequency band (such as radio wave equipment using radio waves with a fractional bandwidth larger than 10%) is utilized.

The technique described in Japanese Laid-Open Patent Publication No. 10-169039 is, however, used for shielding a radio wave of a specific frequency, and hence, it is difficult to employ this technique to adjust the radio wave environment in an office or the like where the radio wave equipment using radio waves of a specific frequency band is utilized.

The present invention was devised to overcome such a conventional problem, and an object of the invention is providing a radio wave shield usable for adjusting the radio wave environment in an office or the like where the radio wave equipment using radio waves of a specific frequency band is utilized.

SUMMARY OF THE INVENTION

In order to achieve the object, the radio wave shield of this invention is constructed so that radio waves of a specific frequency band can be selectively shielded.

DETAILED DESCRIPTION OF THE INVENTION

A preferred embodiment of the invention will now be described in detail with reference to the accompanying drawings.

Figure 1:
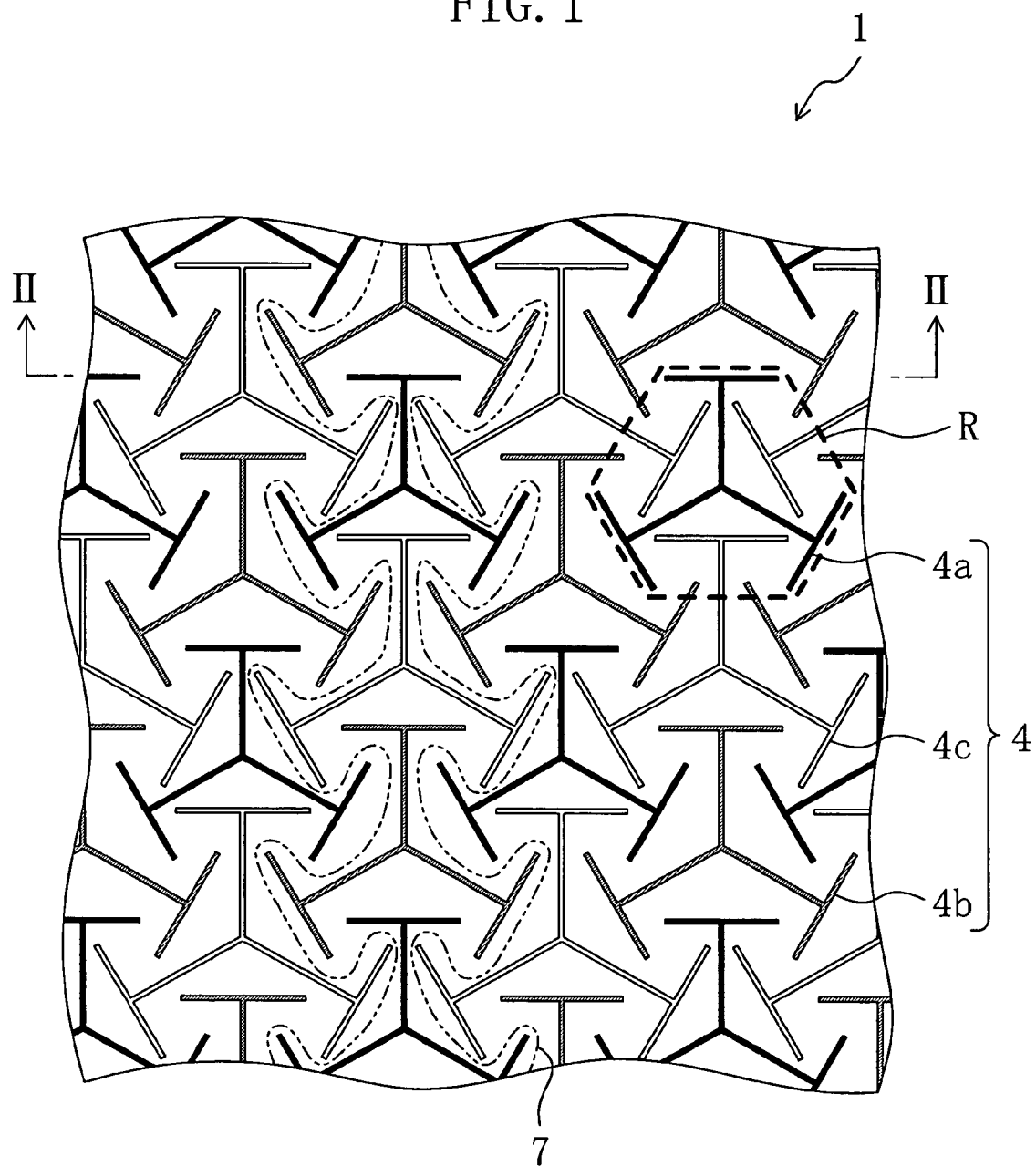
FIG. 1 is a plan view of a radio wave shield.

FIG. 1 is a plan view of a radio wave shield 1 of this embodiment.

Figure 2:
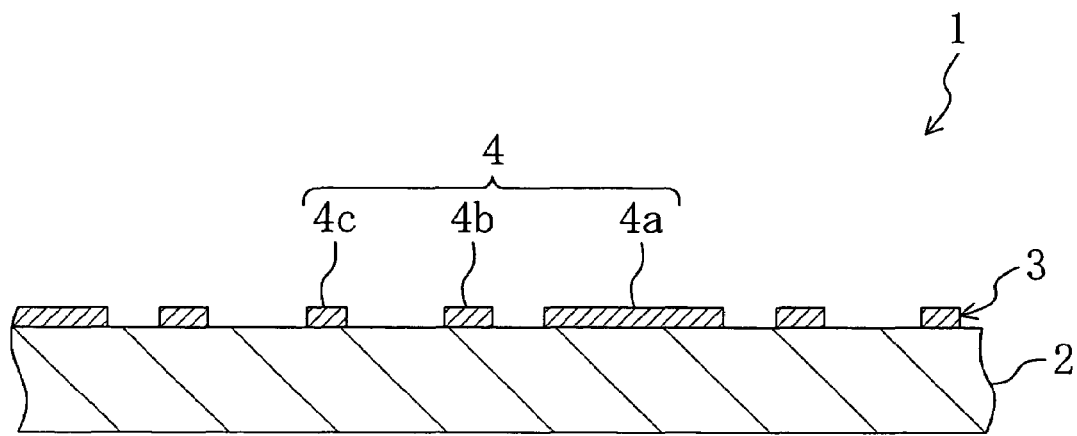
FIG. 2 is a cross-sectional view taken on line II-II of FIG. 1.

FIG. 2 is a cross-sectional view thereof taken on line II-II of FIG. 1.

Figure 3:
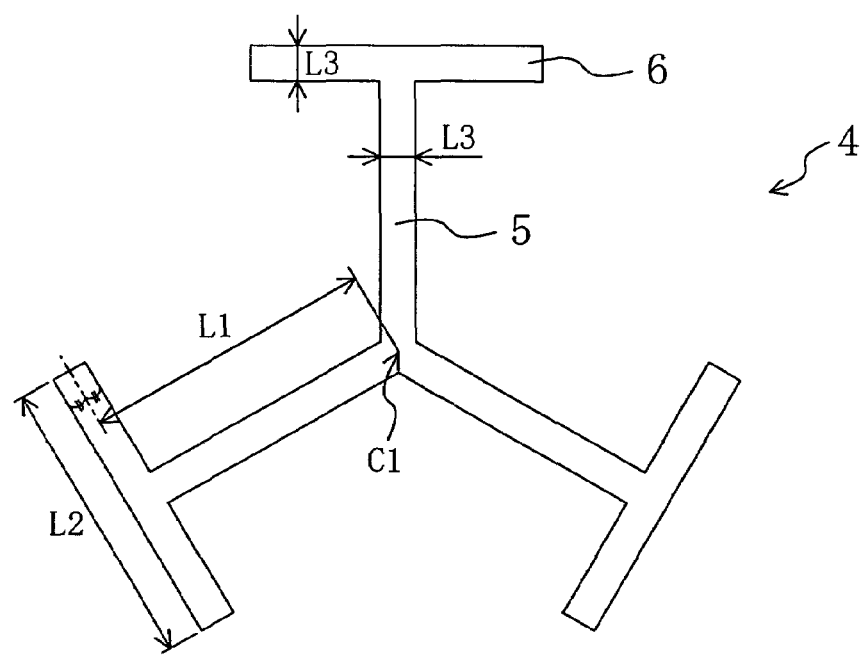
FIG. 3 is a plan view for showing the plane shapes of antennas.

FIG. 3 is a plan view for showing the plane shapes of antennas 4 (antennas 4a, 4b and 4c).

The radio wave shield 1 includes a substrate 2 and a reflecting layer 3. The reflecting layer 3 is formed on the substrate 2 so as to cover portions of the substrate. Although the reflecting layer 3 is formed on the substrate 2 in the radio wave shield 1 of this embodiment, the reflecting layer 3 may be buried in the substrate.

The material of the substrate 2 can be appropriately selected in accordance with the application of the radio wave shield 1. The substrate 2 can be made of, for example, a resin, glass, paper, rubber, plaster, a tile or wood.

When the radio wave shield 1 is constructed to be optically transparent, the substrate 2 should be made of a transparent material. In this case, the substrate 2 can be made of transparent glass or resin. In particular, in the case where the radio wave shield 1 is to be rolled up or needs to be comparatively thin, a resin that can be processed into a small thickness and is good at flexibility is suitably used.

Specific examples of the glass are soda-lime glass and quartz glass, among which soda-lime glass is preferred because it is inexpensive.

Specific examples of the transparent resin are polyethylene terephthalate, polyether sulfone, polystyrene, polyethylene naphthalate, polyacrylate, polyether ether ketone, polycarbonate, polyethylene, polypropylene, polyamide (such as nylon 6), polyimide, a cellulose resin (such as triacetyl cellulose), polyurethane, a fluororesin (such as polytetrafluoroethylene), a vinyl compound (such as polyvinyl chloride), polyacrylic acid, polyacrylic ester, polyacrylonitrile, an addition polymer of a vinyl compound, polymethacrylic acid, polymethacrylate, a vinylidene compound (such as polyvinylidene chloride), a vinylidene fluoride-trifluoroethylene copolymer, a copolymer of a vinyl compound (such as an ethylene/vinyl acetate copolymer) or a fluorine-based compound, polyether (such as polyethylene oxide), epoxy resin, polyvinyl alcohol and polyvinyl butyral.

In the case where the substrate 2 is made of a transparent resin, the thickness is preferably approximately 10 μm or more and approximately 500 μm or less, more preferably approximately 30 μm or more and approximately 150 μm or less, and further preferably approximately 50 μm or more and approximately 120 μm or less. When the substrate 2 has a thickness smaller than 10 μm, it tends be difficult to form the reflecting layer 3. When the substrate 2 has a thickness larger than 500 μm, the flexibility of the substrate 2 is too low to roll it up. Also, when the substrate 2 has a thickness larger than 500 μm, its translucent property may be lowered.

For increasing the area of the reflecting layer 3, the substrate 2 is preferably in a shape having a plate-like, sheet-like or film-like surface (namely, a facing material).

In particular, the substrate 2 preferably not only plays a role to secure the mechanical durability of the radio wave shield 1 but also provides various characteristics (such as a translucent property, non-combustibility, flame resistance, a non-halogen property, flexibility, shock resistance and heat resistance) to the radio wave shield 1.

It is noted that the radio wave shield 1 may be adhesive to an existing object within a room (such as a window, a wall, a ceiling, a floor, a partition or a desk). Specifically, the radio wave shield 1 may be embodied as follows: A pressure sensitive adhesive or an adhesive is applied at least one of the surface on which the reflecting layer 3 is formed and the opposite surface, a protecting layer is provided on the pressure sensitive adhesive or the adhesive, and the resultant radio wave shield is rolled up, so as to be cut into a necessary length.

FIGS. 4 through 7 show examples of a product pattern (application) of the radio wave shield 1 of this embodiment.

Figure 4:
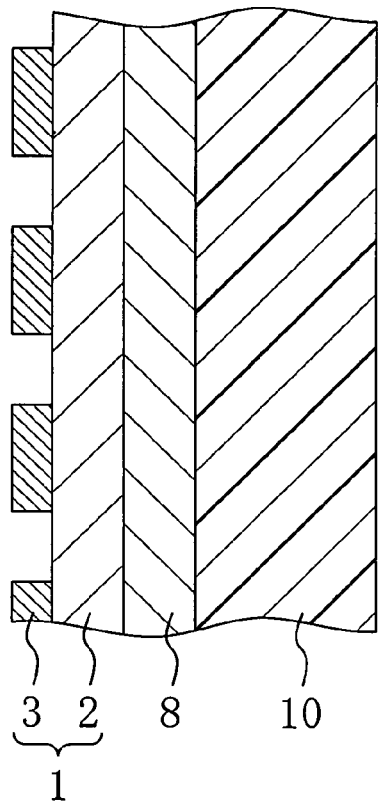
FIG. 4 is a cross-sectional view of a radio wave shield adhered onto glass (windowpane) on the side of a substrate.

FIG. 4 is a cross-sectional view obtained in application where the side of the substrate 2 of the radio wave shield 1 is adhered onto glass (windowpane) 10. In FIG. 4, the radio wave shield 1 is adhered onto the glass 10 with a pressure sensitive adhesive 8 provided on the substrate 2 of the radio wave shield 1.

Figure 5:
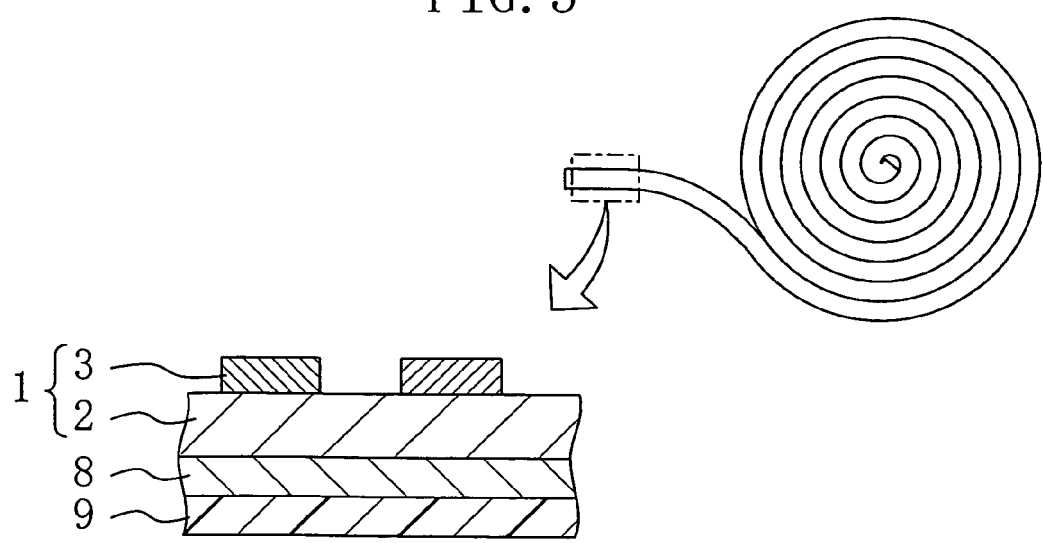
FIG. 5 is a schematic diagram of a radio wave shield having a pressure sensitive adhesive and a protecting film on its substrate and rolled up like toilet paper.

FIG. 5 is a schematic diagram obtained when the radio wave shield 1 has a pressure sensitive adhesive 8 and a protecting film 9 on its substrate 2 and is rolled up. The radio wave shield 1 shown in FIG. 5 can be cut into a necessary length to be adhered onto glass or the like with the protecting film 9 peeled off.

Figure 6:
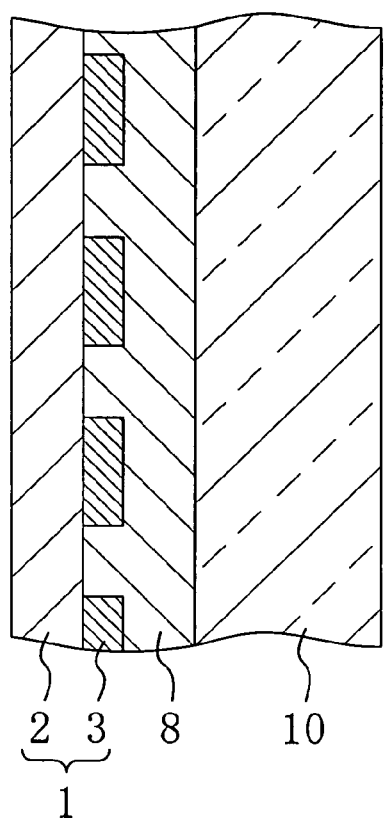
FIG. 6 is a cross-sectional view of a radio wave shield adhered onto glass (windowpane) on the side of a reflecting layer.

FIG. 6 is a cross-sectional view obtained in application where the side of the reflecting layer 3 of the radio wave shield 1 is adhered onto glass (windowpane) 10. In FIG. 6, the radio wave shield 1 is adhered onto the glass 10 with a pressure sensitive adhesive 8 provided on the reflecting layer 3 of the radio wave shield 1.

Figure 7:
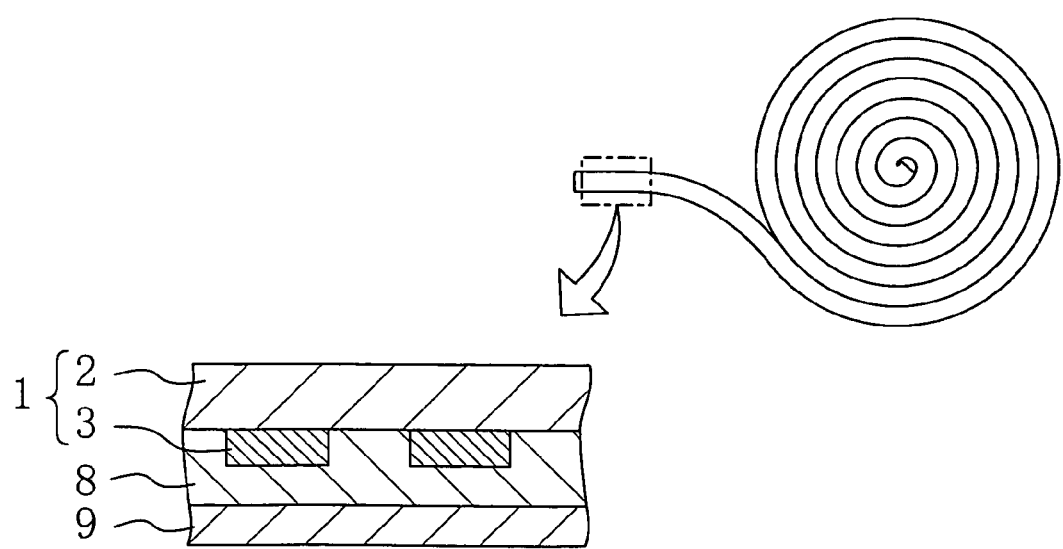
FIG. 7 is a schematic diagram of a radio wave shield having a pressure sensitive adhesive and a protecting film on its protecting layer and rolled up like toilet paper.

FIG. 7 is a schematic diagram obtained when the radio wave shield 1 has a sensitive adhesive 8 and a protecting film 9 on its reflecting layer 3 and is rolled up. The radio wave shield 1 shown in FIG. 7 can be cut into a necessary length to be adhered onto glass or the like with the protecting film 9 peeled off.

Next, the structure of the reflecting layer 3 of this embodiment will be described in detail with reference to FIGS. 1 through 3.

The reflecting layer 3 formed on the substrate 2 includes a plurality of first antennas 4a, a plurality of second antennas 4b and a plurality of third antennas 4c (and hereinafter the first antennas 4a, the second antennas 4b and the third antennas 4c are sometimes generically designated as antennas 4). The first antenna 4a, the second antenna 4b and the third antenna 4c selectively reflect radio waves of specific frequencies different from one another.

In this embodiment, the first antenna 4a, the second antenna 4b and the third antenna 4c are analogous to one another (whereas their dimensions are ascending in the order of the second antenna 4b, the first antenna 4a and the third antenna 4c). However, the first antenna 4a, the second antenna 4b and the third antenna 4c may not be analogous to one another. In other words, the reflecting layer 3 may include a plurality of kinds of antennas mutual different in the shape.

The first antenna 4a, the second antenna 4b and the third antenna 4c have radio wave reflecting (shielding) spectrum peaks not independent of (continuous to) one another. Accordingly, the radio wave shield 1 can selectively shield radio waves of a frequency band including a frequency of a radio wave reflected by the first antenna 4a, a frequency of a radio wave reflected by the second antenna 4b and a frequency of a radio wave reflected by the third antenna 4c (for example, a frequency band not less than approximately 815 MHz and not more than approximately 925 MHz). For example, the radio wave shield 1 of this embodiment has a radio wave shielding property (a property to attenuate transmitting radio waves) shown in FIG. 8.

Figure 8:
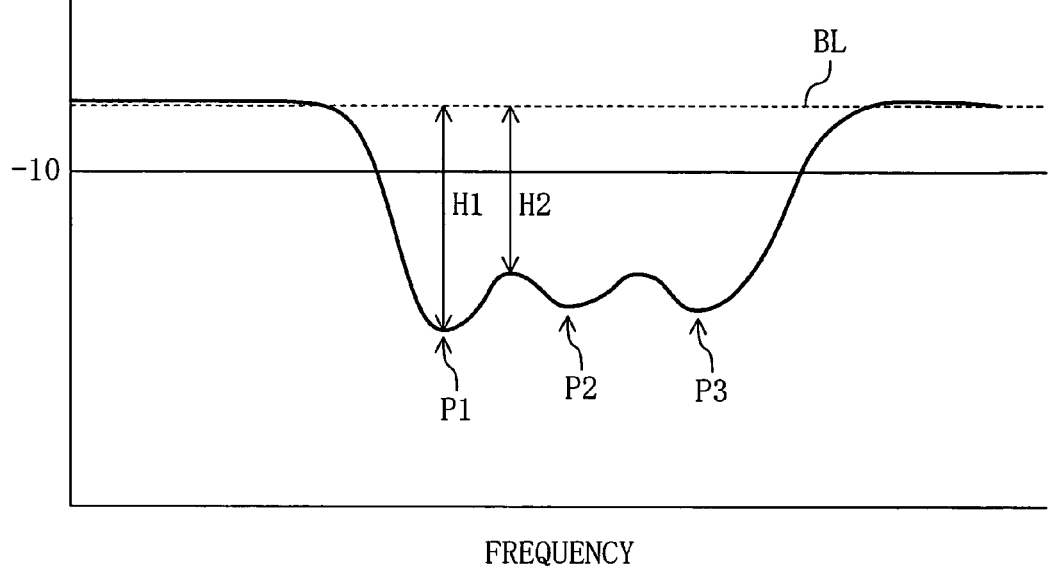
FIG. 8 is a schematic graph for exemplifying the correlation between a frequency and a radio wave shielding degree (attenuation of transmitting radio waves) attained by the radio wave shield.

FIG. 8 is a schematic graph for exemplifying the correlation between a frequency and a radio wave shielding degree (attenuation of transmitting radio waves) obtained by the radio wave shield 1 of this embodiment.

As shown in FIG. 8, in the radio wave shield 1 of this embodiment, a spectrum peak P2 of the first antenna 4a, a spectrum peak P3 of the second antenna 4b and a spectrum peak P1 of the third antenna 4c are not independent of one another but continuous to one another. Specifically, a ratio of a depth H2 of a valley from a base line BL to a depth of the largest peak P1 from the base line BL is 50% or more (namely, approximately 3 dB or more). In the radio wave shield 1 of this embodiment, radio waves of the whole frequency band between the peak P1 and the peak P3 can be shielded at a high shielding-factor of approximately 10 dB or more. Also, the fractional bandwidth of 10 dB exceeds 10%. Accordingly, when the radio wave shield 1 is used, the radio wave environment in an office or the like where radio wave equipment using the radio waves of the specific frequency band is utilized can be suitably adjusted.

It is noted that the fractional bandwidth of 10 dB is expressed as $2(F_{max}-F_{min})/(F_{max}+F_{min})$, wherein $F_{max}$ is the maximum value of a frequency of a radio wave shielded at 10 dB or more and $F_{min}$ is the minimum value of the frequency of the radio wave shielded at 10 dB or more.

Furthermore, a radio wave shield that "selectively shields radio waves of a specific frequency band" herein means a radio wave shield in which the fractional bandwidth of 10 dB (preferably of 20 dB and more preferably of 30 dB) exceeds 10%. On the contrary, a radio wave shield that "selectively shields a radio wave of a specific frequency" means a radio wave shield in which the fractional bandwidth of 10 dB is 10% or less.

Moreover, "radio wave reflecting spectrum peaks independent of (not continuous to) one another" herein means that a ratio of the minimum radio wave reflecting (shielding) factor at a valley between spectrum peaks to a radio wave reflecting (shielding) factor at the largest spectrum peak among radio wave shielding spectra (radio wave reflecting spectra) of the radio wave shield is smaller than 50% (smaller than 3 dB). On the other hand, "radio wave reflecting spectrum peaks not independent of (continuous to) one another" herein means that a ratio of the minimum radio wave reflecting (shielding) factor at a valley between spectrum peaks to a radio wave reflecting (shielding) factor at the largest spectrum peak among radio wave shielding spectra (radio wave reflecting spectra) of the radio wave shield is 50% or more (3 dB or more).

It is noted that a radio wave shield capable of suitably shielding radio waves of the whole specific frequency band cannot be realized by simply forming, in a reflecting layer, a plurality of kinds of antennas largely different in the dimension.

Figure 9:
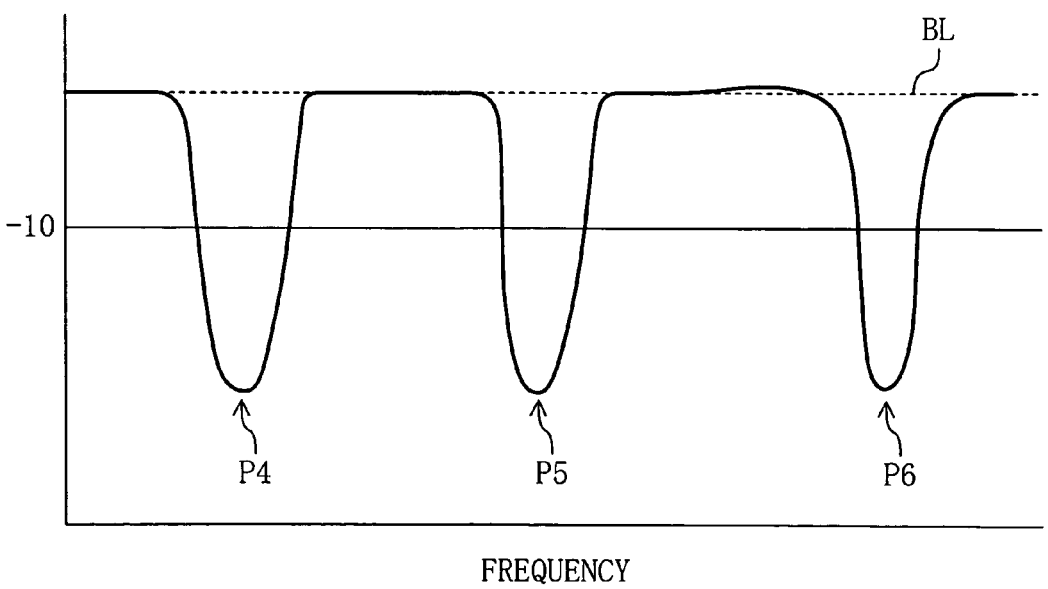
FIG. 9 is a schematic graph for showing the correlation between a frequency and a radio wave shielding degree (attenuation of transmitting radio waves) attained by a radio wave shield including three kinds of antennas largely different in their dimensions.

For example, FIG. 9 is a schematic graph for showing the correlation between a frequency and a radio wave shielding degree (attenuation of transmitting radio waves) of a radio wave shield including three kinds of antennas largely different from one another in their dimensions.

As shown in FIG. 9, when the dimensions of the three kinds of antennas are largely different from one another, spectrum peaks P4 through P6 of the respective antennas are independent of and not continuous to one another. Therefore, this radio wave shield cannot suitably shield radio waves of the whole frequency band between the peak P4 and the peak P6. Specifically, radio waves of frequencies between the respective peaks cannot be properly shielded.

Only when the reflecting layer 3 includes the plural kinds of antennas 4a, 4b and 4c whose radio wave shielding spectra (radio wave reflecting spectra) are not independent of (continuous to) one another as in this embodiment, a radio wave shield capable of selectively shielding a specific frequency band can be realized.

Now, the shape of each antenna 4 of this embodiment will be described in detail with reference to FIG. 3.

As shown in FIG. 3, the antenna 4 is composed of three first elements 5 and three second elements 6. The three first elements 5 have substantially the same length. The three first elements 5 extend from an antenna center C1 radially at an angle of approximately 120 degrees from one another. The three second elements 6 have substantially the same length. The three second elements 6 are connected to the outer ends of the different first elements 5. It is noted that the second elements 6 are preferably spaced from one another. In other words, the three second elements 6 are preferably disposed so as not to come in contact with one another. Hereinafter, the antenna 4 in such a shape is sometimes designated as a "T-Y type antenna".

The frequency of a radio wave reflected by the antenna 4 is determined principally depending upon the length L1 of the first element 5. Specifically, as the length L1 of the first element 5 is larger, the frequency of the radio wave reflected by the antenna 4 is lower. In this embodiment, the second antenna 4b having the smallest length L1 of the first element 5 reflects a radio wave of the highest frequency. The third antenna 4c having the largest length L1 of the first element 5 reflects a radio wave of the lowest frequency. The first antenna 4a reflects a radio wave of an intermediate frequency between the frequency of the radio wave reflected by the second antenna 4b and the frequency of the radio wave reflected by the third antenna 4c.

In order that the first antenna 4a, the second antenna 4b and the third antenna 4c have the radio wave reflecting (shielding) spectrum peaks not independent of (continuous to) one another, a ratio of a difference in the length L1 of the first element 5 between the first antenna 4a and the second antenna 4b to the length L1 of the first element 5 of the first antenna 4a having the intermediate dimension is preferably approximately 15% or less. In addition, a ratio of a difference in the length L1 of the first element 5 between the first antenna 4a and the third antenna 4c to the length L1 of the first element 5 of the first antenna 4a having the intermediate dimension (hereinafter, referred to as the "first element ratio") is preferably approximately 15% or less. In other words, between the two antennas 4 having the dimensions close to each other, the first element ratio is preferably approximately 15% or less, more preferably approximately 10% or less and further preferably approximately 5% or less.

As the first element ratio is smaller, the independency among the radio wave reflecting (shielding) spectrum peaks of the antennas 4a, 4b and 4c tends to be lowered (namely, the continuality tends to be improved). Accordingly, variation in the shielding factor (reflecting factor) against frequencies of the whole specific frequency band tends to be reduced. However, when the first element ratio is less than 5%, the fractional bandwidth (band width) of the frequency band shielded by the radio wave shield 1 tends to be small. Accordingly, the first element ratio is particularly preferably approximately 5% or more and approximately 15% or less (and more preferably approximately 10% or less).

A length L2 of the second element 6 may be the same as or different from the length L1 of the first element 5. In the case where the first element 5 and the second element 6 are perpendicular to each other and the second element 6 is connected to the outer end of the first element 5 at the center, the length L1 of the first element 5 and the length L2 of the second element 6 preferably satisfy a relationship of $0<L2<2(3)^{1/2}/L1$. Furthermore, the length L2 of the second element 6 is preferably not less than approximately 0.5 times and not more than approximately 2 times as large as the length L1 of the first element 5. More preferably, the length L2 is not less than approximately 0.75 times and not more than approximately 2 times as large as the length L1. In the case where the length L2 of the second element 6 is not less than $2(3)^{1/2}/L1$, the second elements 6 adjacent to each other come into contact with each other, and hence, a desired radio wave shielding effect cannot be attained. In other words, the conditional expression of $L2<2(3)^{1/2}/L1$ defines a condition for avoiding mutual contact (interference) of the second elements 6.

The length L2 of the second element 6 also affects the frequency of a radio wave reflected by the antenna 4 although the influence is smaller than that of the length L1 of the first element 5. Therefore, the frequency of a radio wave reflected by the antenna 4 can be finely adjusted by controlling the length L2 of the second element 6. Accordingly, when the T-Y type antenna like the antenna 4 is employed, the radio wave shield 1 can be easily designed with a large design width for a frequency band to be shielded.

The width of the first element 5 may be the same as or different from the width of the second element 6. In this embodiment, the first element 5 and the second element 6 have substantially the same width L3. In this embodiment, a difference in the width between the first element 5 and the second element 6 is preferably approximately 5% or less of the width of the first element 5.

The width L3 of the first element 5 and the second element 6 is correlated with the frequency selectivity of the antenna 4. Specifically, as the width L3 is smaller, the frequency selectivity of the antenna 4 tends to be higher and as the width L3 is larger, the frequency selectivity of the antenna 4 tends to be lower. In other words, as the width L3 is larger, the variation in shielding radio waves of the specific frequency band tends to be reduced. Therefore, the width L3 is preferably approximately 0.3 mm or more. Also, the width L3 is preferably 3 mm or less. When the width L3 is smaller than approximately 0.3 mm, it may be difficult to form the antenna 4.

In this embodiment, the antenna 4 is made of a conducting material. In other words, the antenna 4 has a conducting property. The radio wave reflecting factor of the antenna 4 against a radio wave of a specific frequency is correlated with the conductivity of the antenna 4. Specifically, as the conductivity of the antenna 4 is higher (namely, the electric resistance of the antenna 4 is lower), the radio wave reflecting factor of the antenna 4 against a radio wave of a specific frequency is larger. Therefore, the radio wave reflecting factor of the antenna 4 against a radio wave of a specific frequency can be increased by increasing the conductivity of the antenna 4. Specifically, the antenna 4 preferably has higher conductivity.

Specifically, the antenna 4 can be made of a conducting material such as aluminum (Al), silver (Ag), copper (Cu), gold (Au), platinum (Pt), iron (Fe), stainless steel, carbon (C), tin oxide ($SnO_2$), zinc oxide (ZnO), cadmium tin oxide (CTO), fluorine-doped tin oxide (FTO), indium tin oxide (ITO) or indium zinc oxide (IZO). Among them, aluminum (Al), silver (Ag) or the like with high conductivity is preferably used. In the case where the application requires optical transparence, tin oxide ($SnO_2$), zinc oxide (ZnO), cadmium tin oxide (CTO), fluorine-doped tin oxide (FTO), indium tin oxide (ITO), indium zinc oxide (IZO), or a mixture or an alloy of any of them is preferably used.

A method for fabricating the antenna 4 is not particularly specified. For example, the antenna 4 may be fabricated as follows: A paste obtained by dispersedly mixing a powder conducting material (such as a silver powder or an aluminum powder) in a binder (such as a polyester resin) (hereinafter which paste is sometimes designated as the "conducting paste") is uniformly applied in a desired pattern on the substrate 2, and the resultant is dried.

The content of the conducting material is preferably approximately 40 wt % or more and approximately 80 wt % or less and more preferably approximately 50 wt % or more and approximately 70 wt % or less. When the content of the conducting material is less than 40 wt %, the conductivity of the antenna 4 tends to be lowered. On the other hand, when the content of the conducting material exceeds 80 wt %, the conducting material is difficult to uniformly disperse in the resin.

The applied paste can be dried, for example, in an atmosphere of approximately 100° C. or more and approximately 200° C. or less. The drying time can be, for example, approximately 10 minutes or more and approximately 5 hours or less.

In the case where the antenna 4 is fabricated by using the conducting paste, the thickness of the antenna 4 is preferably approximately 10 μm or more and approximately 20 μm or less. When the thickness of the antenna 4 is smaller than 10 μm, the conductivity of the antenna 4 tends to be lowered.

When the thickness of the antenna 4 exceeds 20 μm, a pattern forming property tends to be lowered.

Alternatively, the antenna 4 may be fabricated by deposition, spattering, chemical vapor deposition (CVD) or the like. Alternatively, the antenna 4 may be fabricated by adhering a thin film of aluminum or the like with a desired pattern onto the substrate 2. Furthermore, the antenna 4 may be fabricated by, for example, a silk screening method, a pattern pressing method, a burying method by fitting a mold or the like.

It is noted that the antenna 4 may be made of a conducting film including a plurality of fine pores. In other words, the antenna 4 may be made of a mesh conducting film.

Next, the arrangement of the antennas 4a, 4b and 4c will be described in detail with reference to FIG. 1.

As shown in FIG. 1, the plural first antennas 4a, the plural second antennas 4b and the plural third antennas 4c form a plurality of antenna series 7 in each of which the first antenna 4a, the third antenna 4c and the second antenna 4b are alternately arranged in this order along one direction. These plural antenna series 7 are arranged in a direction crossing (typically rectangularly) the extending direction of the antenna series 7. In other words, the plural antennas 4a, 4b and 4c are two-dimensionally arranged on the substrate 2.

Each first antenna 4a is adjacent to a second antenna 4b and a third antenna 4c belonging to another antenna series 7 adjacent to its own antenna series 7. Similarly, each second antenna 4b is adjacent to a first antenna 4a and a third antenna 4c belonging to another antenna series 7 adjacent to its own antenna series 7. Each third antenna 4c is adjacent to a first antenna 4a and a second antenna 4b belonging to another antenna series 7 adjacent to its own antenna series 7.

Furthermore, the antenna center C1 of each first antenna 4a forms a triangle (and preferably an equilateral triangle) together with antenna centers C1 of adjacent first antennas 4a belonging to antenna series 7 disposed on the both sides of its own antenna series 7. Also, the antenna center C1 of each second antenna 4b forms a triangle (and preferably an equilateral triangle) together with antenna centers C1 of adjacent second antennas 4b belonging to antenna series 7 disposed on the both sides of its own antenna series 7. Also, the antenna center C1 of each third antenna 4c forms a triangle (and preferably an equilateral triangle) together with antenna centers C1 of adjacent third antennas 4c belonging to antenna series 7 disposed on the both sides of its own antenna series 7.

When the antennas 4a, 4b and 4c are thus arranged, the plural antenna series 7 can be densely disposed along the row direction so that, for example, the second element 6 of the first antenna 4a can be fit between the second antenna 4b and the third antenna 4c belonging to the adjacent antenna series 7. In other words, the antennas 4 can be densely arranged in such a manner that second elements 6 of adjacent antennas 4 are disposed within a region R of a first antenna 4a as shown in FIG. 1. Accordingly, a larger number of antennas 4a, 4b and 4c can be densely disposed in a unit area.

At this point, the radio wave shielding factor of the radio wave shield 1 is correlated with the number of antennas 4 disposed in a unit area. Specifically, as the number of antennas 4 disposed in a unit area is larger, the radio wave shielding factor of the radio wave shield 1 is higher. Therefore, a higher radio wave shielding factor can be realized by densely arranging the antennas 4 in the aforementioned manner.

Furthermore, in the aforementioned arrangement of the antennas 4, the numbers of first antennas 4a, second antennas 4b and third antennas 4c included in a unit area can be substantially the same. Therefore, the shielding variation in radio wave frequency bands can be suppressed.

In order to increase the number of antennas 4 disposed in a unit area, the second element 6 is preferably shorter than the first element 5 (namely, the length L2 is preferably shorter than the length L1). Thus, the interference of each second element 6 with an adjacent antenna 4 can be effectively suppressed.

Also, the plural antennas 4 are arranged so as not to allow the second elements 6 to oppose one another in parallel in this embodiment. Therefore, the frequency selectivity of the antennas 4 can be kept comparatively low. In other words, the fractional bandwidth of the antennas 4 can be kept comparatively wide. Accordingly, a high radio wave shielding factor less biased against the radio waves of the whole of the specific frequency band can be realized.

Although the lengths L1 of the three first elements 5 are substantially the same in this embodiment, the lengths L1 of the three first elements 5 may be different from one another.

Although the three kinds of antennas 4 are analogous to one another in this embodiment, the reflecting layer 3 may include a plurality of kinds of antennas 4 not analogous to one another.

Furthermore, the reflecting layer 3 of the radio wave shield 1 of this embodiment includes the first antennas 4a, the second antennas 4b and the third antennas 4c alone, which does not limit the invention. The reflecting layer 3 may partly include, for example, a pattern different from the antennas 4a, 4b and 4c.

Although the reflecting layer 3 includes the three kinds of antennas 4 in this embodiment, the reflecting layer 3 may include four or more kinds of antennas 4. For example, in the case where plural kinds of antennas 4 included in the reflecting layer 3 are analogous to one another, the dimension of each kind of antennas 4 is set preferably in a range of approximately ±15% (more preferably ±10% and further preferably ±5%) of the dimension of one kind of antennas 4 regarded as a reference out of all kinds of antennas 4 included in the reflecting layer 3.

Although each antenna 4 is what is called a T-Y type antenna in this embodiment, each antenna 4 may be composed of merely plurality of first elements, for example, in the shape of lines extending from the antenna center. Specifically, each antenna 4 may be a Y-shaped antenna composed of three first elements alone.

Alternatively, each antenna 4 may be composed of two or less or four or more line-shaped first elements extending from the antenna center and line-shaped second elements respectively connected to the outer ends of the first elements. Specifically, each antenna 4 may be what is called a Jerusalem-cross type antenna composed of four line-shaped first elements having substantially the same length and extending from the antenna center radially at an angle of approximately 90 degrees from one another and line-shaped second elements respectively connected to the outer ends of the first elements.

Furthermore, the reflecting layer 3 may include a plurality of types of antennas such as a T-Y type antenna, a Y-shaped antenna and a Jerusalem-cross type antenna.

It is noted that the dimension and the shape of the radio wave shield 1 are not particularly specified. The radio wave shield 1 may be in a small shape with a side of several millimeters or in a large shape with a side of several meters or more.

Also, the plane shape of the radio wave shield 1 may be triangular, rectangular (including square), polygonal, circular or elliptical.

EXAMPLE

A radio wave shield 1 having the same structure as the radio wave shield 1 of the above-described embodiment shown in FIGS. 1 and 6 was fabricated for measuring its radio wave shielding characteristic. Specifically, a PET film (with a thickness of 180 μm) was used as a substrate 2, on which antennas 4 were formed by applying a silver paste and drying the resultant. Thereafter, with the surface where the antennas 4 were provided facing downward, the substrate 2 was adhered onto glass 7 (specifically, soda-lime glass with a thickness of 5 mm) with an acrylic pressure sensitive adhesive 8, so as to obtain the radio wave shield of this example. In this example, the lengths of a first element 5 and a second element 6 of a second antenna 4b were both 28 mm. The lengths of the first element 5 and the second element 6 of a first antenna 4a were 29.4 mm. Also, the lengths of the first element 5 and the second element 6 of a third antenna 4c were 26.6 mm. In other words, the length of the first element 5 and the second element 6 of the first antenna 4a was 1.05 times as large as that of the second antenna 4b, and that of the third antenna 4c was 0.95 times as large as that of the first antenna 4a. Also, the widths of the first element 5 and the second element 6 were 1.2 mm.

After the fabrication, the attenuation of transmitting radio waves (radio wave shielding degree) attained by the radio wave shield of this example was measured with an apparatus HP8722D manufactured by Agilent Technologies.

Figure 10:
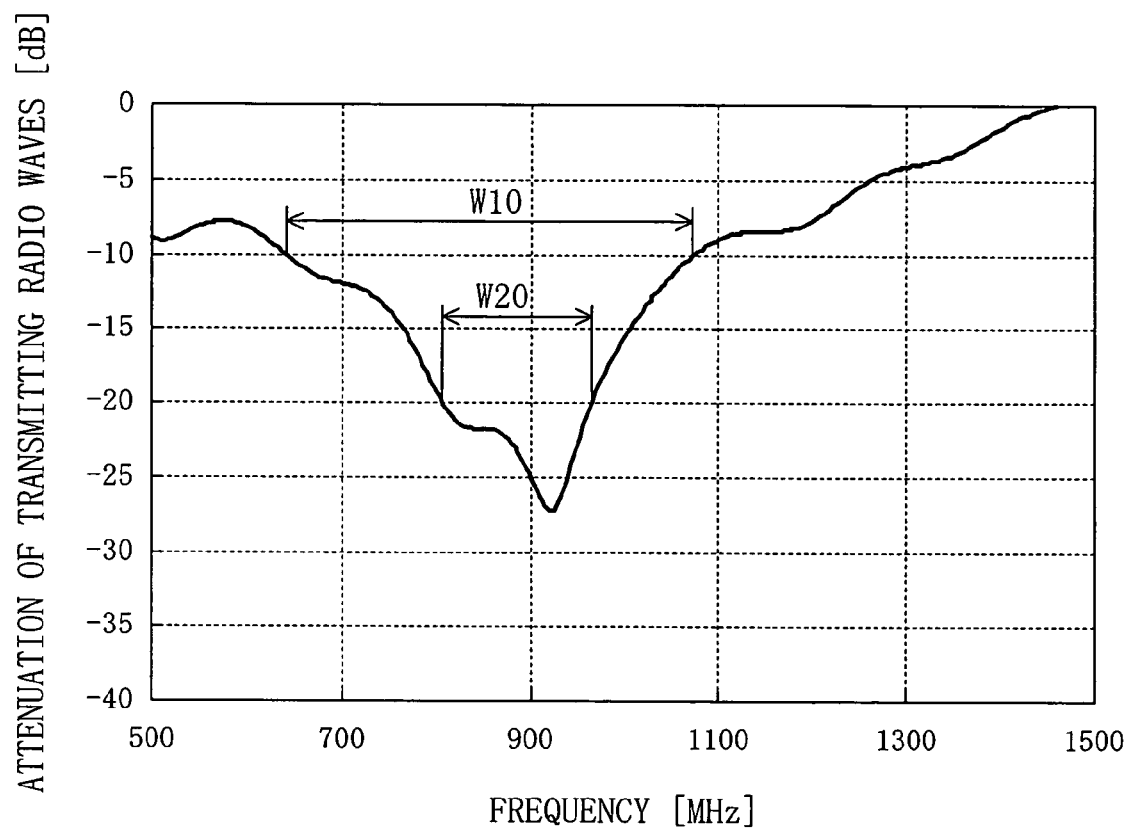
FIG. 10 is a graph for showing the correlation between a frequency and attenuation of transmitting radio waves attained by a radio wave shield of an example.

FIG. 10 is a graph for showing the correlation between a frequency and the attenuation of transmitting radio waves attained by the radio wave shield of this example.

As shown in FIG. 10, the radio wave shield of this example shielded radio waves of frequencies of 641 MHz through 1073 MHz at 10 dB or more. Also, it shielded radio waves of frequencies of 807.5 MHz through 960.5 MHz at 20 dB or more. In other words, its 10-dB band width (W10) was 432 MHz and a 10-dB fractional band with was 47.0%. Its 20-dB band width (W20) was 153 MHz and a 20-dB fractional bandwidth was 16.6%.

As a result, it was found that the radio wave shield of this example can appropriately shield radio waves of the whole of a frequency band with a comparatively large fractional bandwidth.

While the present invention has been described in a preferred embodiment, it is to be understood that the invention is not limited to the specific embodiment. It will be apparent to those skilled in the art that the embodiment is illustrative and not restrictive and the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A radio wave shield for selectively shielding radio waves of a specific frequency band, comprising:
   a plurality of kinds of antennas respectively for selectively reflecting radio waves of specific different frequencies,
   wherein said plurality of kinds of antennas include three kinds of antennas of a first antenna, a second antenna and a third antenna,
   said first antenna, said second antenna and said third antenna are successively arranged alternately to form an antenna series, and
   a plurality of said antenna series are two-dimensionally arranged in parallel.

2. The radio wave shield of claim 1,
wherein said plurality of kinds of antennas have a conducting property.

3. The radio wave shield of claim 1, wherein each of said plurality of kinds of antennas has:
three line-shaped first elements having substantially the same length and extending radially from an antenna center at an angle of approximately 120 degrees from one another; and
three line-shaped second elements respectively connected to outer ends of said first elements.

4. The radio wave shield of claim 3,
wherein said plurality of kinds of antennas are different from one another in the length of said first elements.

5. The radio wave shield of claim 3,
wherein each of said second elements is shorter than each of said first elements in said plurality of kinds of antennas.

6. The radio wave shield of claim 3,
wherein said plurality of kinds of antennas are arranged so as not to allow said second elements to oppose one another in parallel.

7. The radio wave shield of claim 1,
wherein a first antenna is adjacent to a second antenna and a third antenna belonging to an antenna series adjacent to an antenna series to which said first antenna belongs.

8. The radio wave shield of claim 1,
wherein said plurality of kinds of antennas are arranged in such a manner that three antenna centers of first antennas belonging to three antenna series adjacent to one another together form a triangle.

9. The radio wave shield of claim 8,
wherein said three antenna centers adjacent to one another together form an equilateral triangle.

10. A radio wave shield comprising:
a plurality of kinds of antennas respectively for selectively reflecting radio waves of different specific frequencies,
wherein said plurality of kinds of antennas have radio wave reflecting spectrum peaks not independent of one another, and
wherein said plurality of kinds of antennas include three kinds of antennas of a first antenna, a second antenna and a third antenna,
said first antenna, said second antenna and said third antenna are successively arranged alternately to form an antenna series, and
a plurality of said antenna series are two-dimensionally arranged in parallel.

11. The radio wave shield of claim 10,
wherein said plurality of kinds of antennas have a conducting property.

12. The radio wave shield of claim 10, wherein each of said plurality of kinds of antennas has:
three line-shaped first elements having substantially the same length and extending radially from an antenna center at an angle of approximately 120 degrees from one another; and
three line-shaped second elements respectively connected to outer ends of said first elements.

13. The radio wave shield of claim 12,
wherein said plurality of kinds of antennas are different from one another in the length of said first elements.

14. The radio wave shield of claim 12,
wherein each of said second elements is shorter than each of said first elements in said plurality of kinds of antennas.

15. The radio wave shield of claim 12,
wherein said plurality of kinds of antennas are arranged so as not to allow said second elements to oppose one another in parallel.

16. The radio wave shield of claim 10,
wherein a first antenna is adjacent to a second antenna and a third antenna belonging to an antenna series adjacent to an antenna series to which said first antenna belongs.

17. The radio wave shield of claim 10,
wherein said plurality of kinds of antennas are arranged in such a manner that three antenna centers of first antennas belonging to three antenna series adjacent to one another together form a triangle.

18. The radio wave shield of claim 17,
wherein said three antenna centers adjacent to one another together form an equilateral triangle.

* * * * *